United States Patent
Freeman et al.

(10) Patent No.: US 10,341,794 B2
(45) Date of Patent: Jul. 2, 2019

(54) ACOUSTICAL METHOD FOR DETECTING SPEAKER MOVEMENT

(71) Applicant: BOSE CORPORATION, Framingham, MA (US)

(72) Inventors: Eric Freeman, Sutton, MA (US); Joseph Gaalaas, Woodbury, MN (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/657,743

(22) Filed: Jul. 24, 2017

(65) Prior Publication Data

US 2019/0028824 A1    Jan. 24, 2019

(51) Int. Cl.
| | |
|---|---|
| *H04R 29/00* | (2006.01) |
| *G10L 21/0232* | (2013.01) |
| *H03G 5/16* | (2006.01) |
| *G10L 25/51* | (2013.01) |
| *G10L 21/0208* | (2013.01) |

(52) U.S. Cl.
CPC ........ *H04R 29/001* (2013.01); *G10L 21/0232* (2013.01); *G10L 25/51* (2013.01); *H03G 5/165* (2013.01); *G10L 2021/02082* (2013.01)

(58) Field of Classification Search
CPC ...... H04R 29/001; H03G 5/165; G10L 21/02; G10L 21/02082; G10L 21/0232; G10L 25/51; G10L 2021/02082
USPC ........................................ 381/56, 58, 59, 66
See application file for complete search history.

(56) References Cited

U.S. PATENT DOCUMENTS

| | | | |
|---|---|---|---|
| 7,215,787 B2 | 5/2007 | Sternad et al. | |
| 7,567,675 B2 | 7/2009 | Bharitkar et al. | |
| 8,005,228 B2 | 8/2011 | Bharitkar et al. | |
| 8,194,885 B2 | 6/2012 | Brannmark et al. | |
| 8,213,637 B2 | 7/2012 | Brannmark et al. | |
| 8,249,260 B2 * | 8/2012 | Tian ...................... | H03G 5/025 381/58 |
| 9,031,268 B2 | 5/2015 | Fejzo et al. | |
| 9,106,192 B2 | 8/2015 | Sheen et al. | |
| 9,164,724 B2 | 10/2015 | Maling, III et al. | |
| 9,521,487 B2 | 12/2016 | Oishi et al. | |
| 9,538,305 B2 | 1/2017 | Lehnert et al. | |
| 9,648,422 B2 | 5/2017 | Sheen et al. | |
| 9,668,049 B2 | 5/2017 | Wilberding et al. | |
| 9,690,271 B2 | 6/2017 | Sheen et al. | |
| 9,690,539 B2 | 6/2017 | Sheen et al. | |
| 9,693,164 B1 | 6/2017 | Kadri et al. | |
| 9,693,165 B2 | 6/2017 | Downing et al. | |
| 9,706,323 B2 | 7/2017 | Sheen | |
| 9,736,584 B2 | 8/2017 | Sheen | |

(Continued)

OTHER PUBLICATIONS

US 9,513,865 B2, 12/2016, Sheen (withdrawn)
US 9,547,470 B2, 01/2017, Sheen et al. (withdrawn)

*Primary Examiner* — William A Jerez Lora
(74) *Attorney, Agent, or Firm* — Lando & Anastasi, LLP

(57) ABSTRACT

Audio speaker systems and methods are provided to detect movement of the speaker system or other device. An audio program content signal is converted into an acoustic signal, and the acoustic signal causes an echo signal. The echo signal is received and a relationship of the echo signal to the audio program content signal is quantified. A quantified value is compared to a stored quantified value and, based upon the comparison, a change in physical position is selectively indicated.

19 Claims, 6 Drawing Sheets

(56) References Cited

U.S. PATENT DOCUMENTS

| | | | | |
|---|---|---|---|---|
| 9,832,569 | B1* | 11/2017 | Ayrapetian | H04R 3/002 |
| 9,991,862 | B2 | 6/2018 | Kim et al. | |
| 2004/0218765 | A1* | 11/2004 | Thiel | H04S 1/00 |
| | | | | 381/56 |
| 2008/0101622 | A1* | 5/2008 | Sugiyama | H04M 9/082 |
| | | | | 381/66 |
| 2010/0150388 | A1* | 6/2010 | Korl | H04R 25/453 |
| | | | | 381/318 |
| 2013/0230180 | A1* | 9/2013 | Thormundsson | H04R 29/00 |
| | | | | 381/56 |
| 2013/0322639 | A1* | 12/2013 | Cleve | H04R 3/02 |
| | | | | 381/66 |
| 2014/0112487 | A1* | 4/2014 | Laska | H04M 9/082 |
| | | | | 381/66 |
| 2014/0161280 | A1* | 6/2014 | Nackvi | H04S 7/301 |
| | | | | 381/98 |
| 2015/0208184 | A1* | 7/2015 | Tan | H04R 29/00 |
| | | | | 381/58 |
| 2017/0288625 | A1 | 10/2017 | Kim et al. | |

* cited by examiner

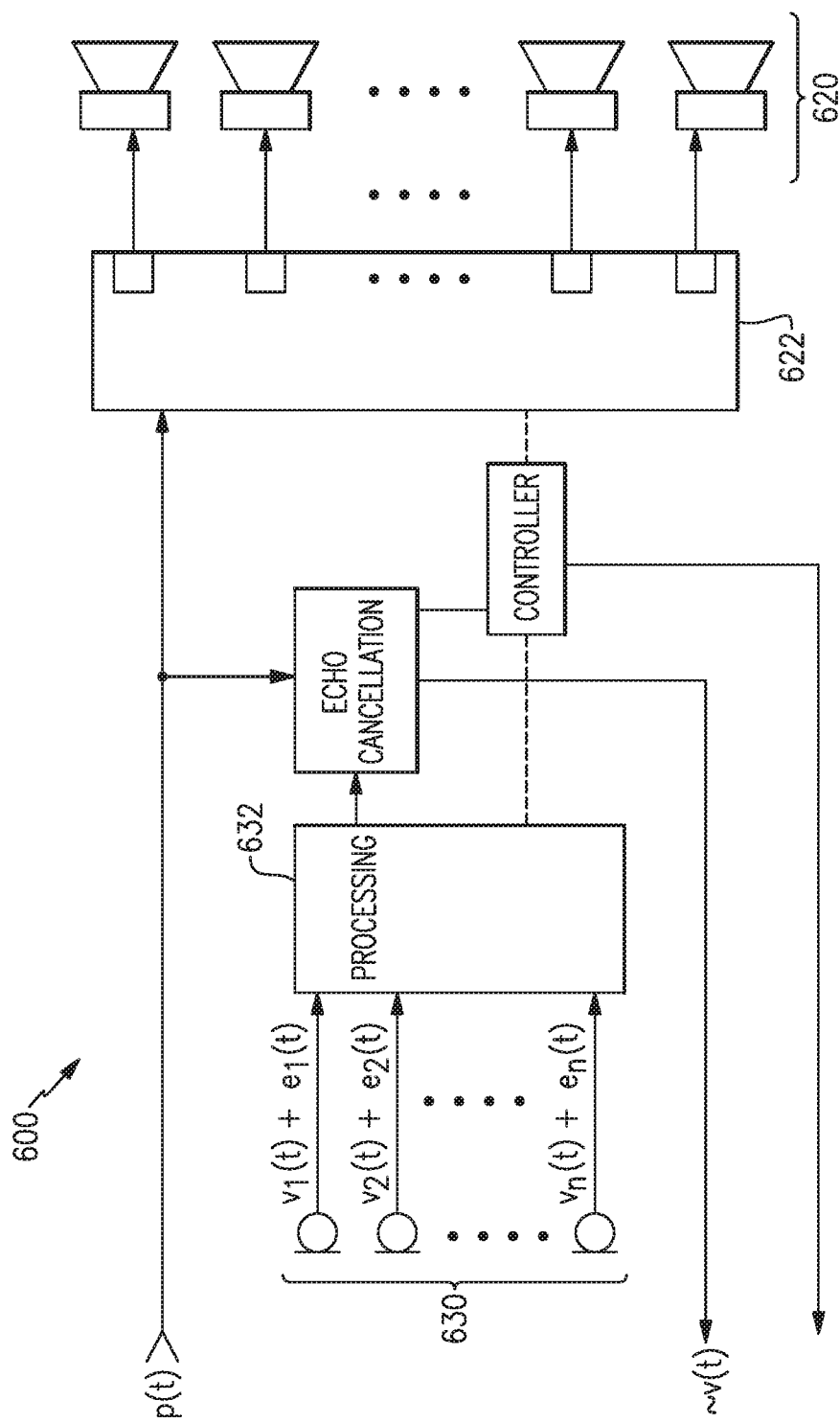

ACOUSTICAL METHOD FOR DETECTING SPEAKER MOVEMENT

TECHNICAL FIELD

Aspects and examples of the present disclosure are directed generally to audio speaker systems and methods, and in some examples, more specifically to systems and methods for acoustically detecting speaker movement.

BACKGROUND

Audio speaker systems are used to produce acoustic signals for various purposes. Entertainment and communication are common applications, such as music or telephone conversations, and may use various audio speaker systems to pick up, convey, and provide acoustic signals to accommodate human users. It is sometimes beneficial to adapt certain audio parameters associated with an audio speaker system dependent upon the acoustic response of the environment in which they are used, and physical movement of the audio speaker system may change the acoustic response of the environment.

SUMMARY

Aspects and examples are directed to audio speaker systems and methods that use acoustic information to determine changes in the acoustic environment in which the audio speaker system operates, which may include by movement of the audio speaker system. In certain examples, the acoustic environment is characterized by an echo cancellation system having various parameters, such as filter coefficients, that change when the audio speaker system is moved. In such examples, movement of the audio speaker system may be detected based upon changes to one or more of the echo cancellation parameters.

In some examples, the acoustic environment may change without movement of the speaker system. For example, movement, addition, or removal of objects in the vicinity of the speaker system may cause acoustic changes to the environment, and may also be detected by changes in echo cancellation parameters. In some examples, alternate parameters are used to characterize the acoustic environment. For example, any parameter suitable to quantify or characterize a relationship between an acoustic signal produced by the speaker system and an echo signal caused by interaction of the acoustic signal with the environment may be suitable to detect certain characteristics of the acoustic environment, such as speaker placement, or to detect changes in the acoustic environment, such as speaker movement. In certain examples, a relationship between an acoustic signal and an echo signal caused, at least in part, by the acoustic signal, may be characterized by a cross-correlation of the two signals. In other examples, the relationship is characterized by an echo canceller system.

According to one aspect, a method is provided for detecting movement of a device. The method includes receiving an audio program content signal, converting the audio program content signal into an acoustic signal, receiving an echo signal, quantifying a relationship between the echo signal and the audio program content signal to provide a quantified value, comparing the quantified value to a stored quantified value, and selectively indicating a change in physical position based at least in part upon the comparison.

The stored quantified value may include one or more adaptive filter coefficients.

In some examples, quantifying a relationship between the echo signal and the audio program content signal includes determining filter coefficients of an adaptive filter. Determining filter coefficients of an adaptive filter may include determining filter coefficients of an echo cancellation system.

In certain examples, quantifying a relationship between the echo signal and the audio program content signal includes performing at least one of a cross-correlation, a least mean squares algorithm, a normalized least mean squares algorithm, and a recursive least square algorithm.

According to some examples, converting the audio program content signal into an acoustic signal includes providing the audio program content signal to an acoustic transducer, and receiving an echo signal includes receiving an acoustic echo signal by a microphone.

In certain examples, the method also includes reconfiguring an equalization based at least in part upon the comparison.

According to another aspect, an audio speaker system is provided that includes an input to receive an audio signal, an acoustic transducer coupled to the input to receive the audio signal and to convert the audio signal into an acoustic signal, an adaptive filter coupled to the input to receive the audio signal and configured to receive an echo signal and to estimate a transfer function between the input and the echo, and a processor coupled to the adaptive filter and configured to compare a quantified value of the adaptive filter to a stored quantified value, and to selectively indicate a change in the acoustic environment based at least in part upon the comparison.

In some examples, the quantified value includes one or more filter coefficients of the adaptive filter.

Certain examples include an echo canceller that includes the adaptive filter.

In some examples, the processor may selectively indicate that the audio speaker system has physically changed position based at least in part upon the comparison.

In some examples, the adaptive filter is configured to estimate the transfer function by performing at least one of a cross-correlation, a least mean squares algorithm, a normalized least mean squares algorithm, and a recursive least square algorithm.

Some examples also include a microphone coupled to the processor and configured to receive an echo of the acoustic signal to provide the echo signal to the adaptive filter. The microphone may be remote from the acoustic transducer in certain examples.

According to yet another aspect, an audio device is provided that includes an acoustic transducer to convert an audio signal into acoustic sound pressure, a microphone to receive an acoustic echo related to the acoustic sound pressure and to convert the acoustic echo into an echo signal, and a processor configured to receive the audio signal and the echo signal, to quantify a relationship between the echo signal and the audio signal, to compare the quantified relationship to a stored quantified value, and to selectively indicate a change in physical position of the audio device based at least in part upon the comparison.

Certain examples include an adaptive filter, and the processor may be configured to determine one or more filter coefficients of the adaptive filter, and to use one or more of the filter coefficients as the quantified relationship between the echo signal and the audio signal.

Some examples include an echo canceller, and the processor may be configured to determine one or more echo cancellation parameters, and to use one or more of the echo cancellation parameters as the quantified relationship between the echo signal and the audio signal.

In some examples, the processor is configured to quantify the relationship between the echo signal and the audio signal by performing at least one of a cross-correlation, a least mean squares algorithm, a normalized least mean squares algorithm, and a recursive least square algorithm.

In certain examples, the processor is further configured to compare a threshold to an amount of change of the quantified relationship, relative to the stored quantified value, to selectively indicate a change in physical position.

In some examples, the processor may notify a user of a need to reconfigure one or more parameters, based in part upon the comparison.

Still other aspects, examples, and advantages are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by a like numeral. For purposes of clarity, not every component may be labeled in every figure. In the figures:

FIG. 6 is a schematic diagram of yet another example audio processing system.

DETAILED DESCRIPTION

Aspects of the present disclosure are directed to audio speaker systems and methods that determine changes in the acoustic environment in which the audio speaker system operates, which may indicate that the audio speaker system has been moved or the environment has changed. Such changes (or movement) may render various previously configured signal processing parameters to be moot, such as equalization settings of the audio speaker system, and thus it is beneficial to detect when an audio speaker system is moved, or the acoustic environment otherwise changes. It can be beneficial to analyze, characterize, and/or quantify the relationship between a program content signal and an echo signal to determine acoustic characteristics of the environment and/or to determine changes to the acoustic characteristics of the environment, including by movement of one or more components of an audio speaker system.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, functions, components, elements, and features discussed in connection with any one or more examples are not intended to be excluded from a similar role in any other examples.

Also, the phraseology and terminology used herein is for the purpose of description and should not be regarded as limiting. Any references to examples, components, elements, acts, or functions of the systems and methods herein referred to in the singular may also embrace embodiments including a plurality, and any references in plural to any example, component, element, act, or function herein may also embrace examples including only a singularity. Accordingly, references in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
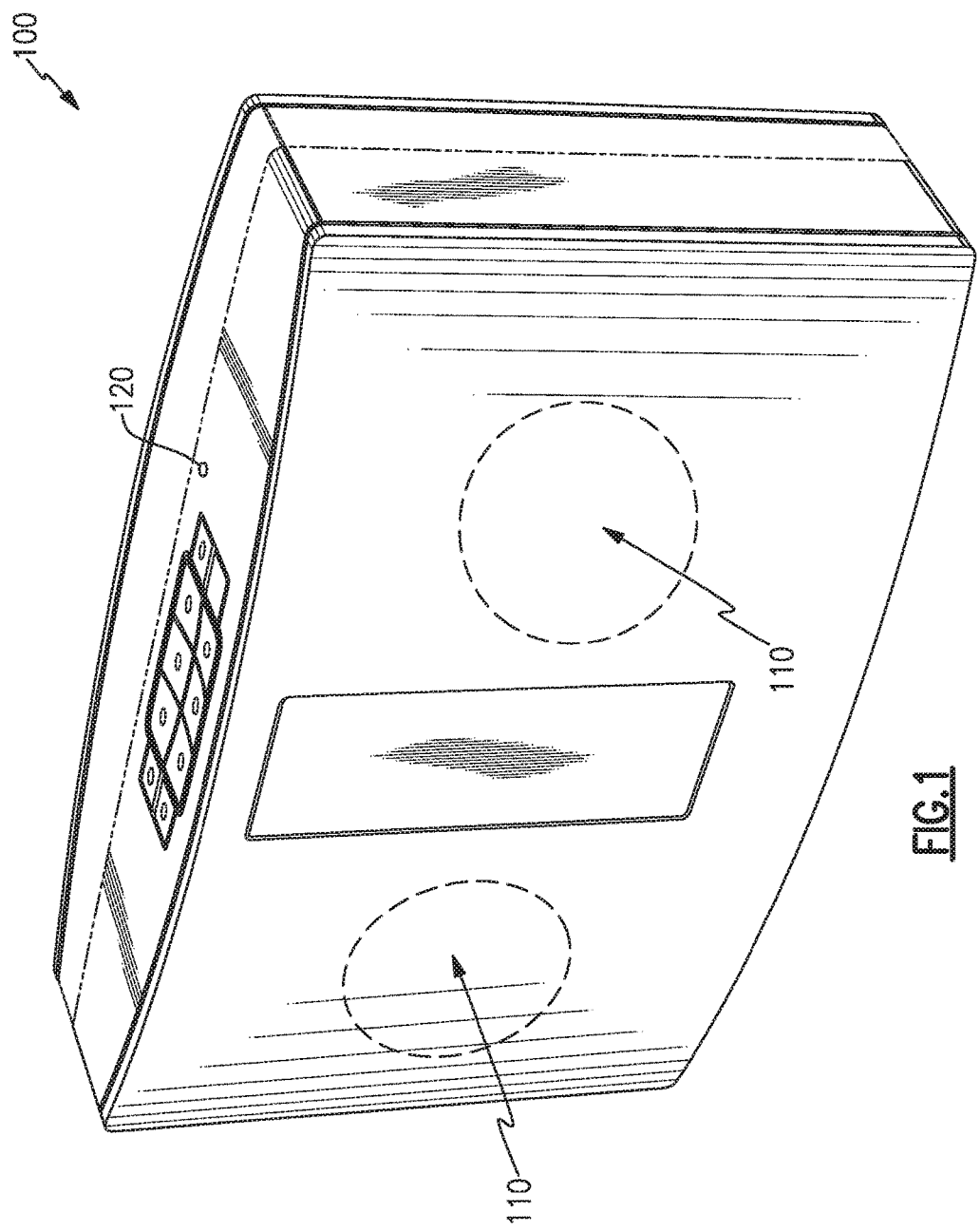
FIG. 1 is a perspective view of an example audio speaker system.

FIG. 1 illustrates an example audio system 100 that includes one or more acoustic drivers 110 that convert audio signals (e.g., electrical) into acoustic signals (e.g., sound pressure waves), and one or more microphones 120 that convert acoustic signals into audio signals for processing.

The audio system 100 may also include an input to receive a program content signal, such as music, speech, and the like. Such an input may include one or more physical electrical connections or may include wireless connections, or any combination of wired and wireless connections. Inputs may also include network interfaces to receive (and optionally to provide) various audio signals. Examples include audio jacks, such as 3.5 mm audio jacks, for example, network interface jacks and/or connectors, such as an RJ-45 connector, for example, Bluetooth® wireless interfaces and hardware, and wireless local area network (WLAN) interfaces and hardware, or any combination of these or other suitable input interfaces. Additionally, the audio system 100 may include other wireless or communications interfaces, such as radio receivers and the like, from which an audio signal containing program content may be received or otherwise derived. Such interfaces may also include inputs to receive commands and control parameters, such as filter settings, equalization, volume, etc.

The audio system 100 may be located in an environment, such as a room, hall, etc., or may be outdoors, and may include certain signal processing parameters, such as equalization parameters, for example, that may be incorporated with the audio system 100 or may be associated with a further audio system of which the audio system 100 is a part. Equalization parameters and/or other signal processing parameters may be desirable to be modified or changed when and if the acoustic environment changes. For example, if the audio system 100 is moved to an alternate location within the environment, or to an alternate environment, it may be desirable to change equalization and/or other parameters associated with the audio system 100. Similarly, a change in the environment, such as removal, installation, or movement of various elements in the environment, such as furniture, artwork, wall renovations, and the like, may sufficiently change the acoustics of the environment that it may be desirable to change equalization and/or other parameters associated with the audio system 100.

In certain examples, an audio system such as the audio system 100 may be a speaker system including terminals for connection to an amplifier. The audio system 100 may be one of a pair of such speaker systems. In other examples, the audio system 100 may form the acoustic transducer set of a speakerphone, to provide transmit and receive acoustic coupling at one location of a telephone or teleconference connection. In some examples, the audio system 100 may be a wireless speaker system for coupling to various audio sources. In further examples, the audio system 100 may be suitable for any of various applications and uses, and may accommodate varying operational requirements for any such applications.

Figure 2:
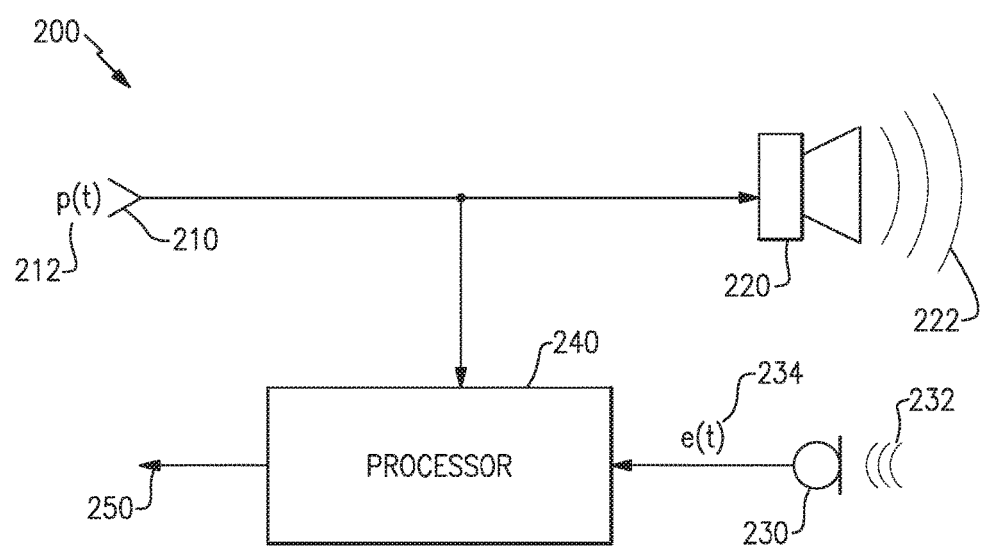
FIG. 2 is a schematic diagram of an example audio processing system such as may be incorporated in the audio speaker system of FIG. 1.

FIG. 2 illustrates an audio processing system 200 that may, for example, be incorporated into the audio system 100 to detect a change in the acoustic environment of the audio system 100, such as a movement of the audio system 100. The system 200 includes an input 210 to receive a program content signal 212, p(t), an acoustic transducer 220 to convert the program content signal 212 into an acoustic signal 222, a microphone 230 to receive an acoustic echo signal 232 and convert it into an echo signal 234, e(t), a processor 240 to receive and process the program content signal 212 and the echo signal 234, and an output 250 to provide, from the processor 240, an indication of a change in the acoustic environment.

The program content signal 212 may be any audio signal desired to be converted into an acoustic signal, for example for human listening, such as music, speech, or a combination thereof, for entertainment, information dissemination, teleconferencing, etc. The acoustic transducer 220 converts the program content signal 212 into acoustic pressure waves, such as the acoustic signal 222, within the surrounding medium, such as air. The environment may include various objects, walls, people, etc., that cause reflections of acoustic energy from the acoustic signal 222, and some of the reflections arrive at the microphone 230 in the form of an acoustic echo signal 232 and are converted into the echo signal 234 by the microphone 230. The echo signal 234 may also include portions coupled directly from the acoustic transducer 220, such as due to mechanical coupling through a chassis or enclosure and/or direct acoustic coupling. Content of the echo signal 234 may be representative of the acoustic response of the environment to the acoustic transducer 220 and the acoustic signal 222, which itself is correlated to the program content signal 212. It should be noted that the microphone 230 may additionally pick up other sounds from the environment, such as other audio systems, people talking, and noise. For simplicity of understanding, it is assumed in this discussion that the microphone 230 receives only an acoustic echo of the acoustic signal 222. Additional acoustic content received by a microphone, such as the microphone 230, is discussed in greater detail below with reference to FIG. 5. With regard to FIG. 2, the echo signal 234 includes reflective content of the acoustic signal 222 from the environment even if it also contains additional content.

The processor 240 may be or include a digital signal processor (DSP) and/or other circuitry, analog or digital, suitable for performing signal processing and other functions in accord with the aspects and examples disclosed herein. Suitable other circuitry may include field programmable gate array(s) (FPGA), application-specific integrated circuit(s) (ASIC), general computing processor(s), microcontroller(s), and the like. The processor 240 may include stored instructions for a digital signal processor, and/or other circuitry, to enable the circuitry, at least in part, to perform the functions described herein.

The processor 240 receives the program content signal 212 and the echo signal 234 and performs processing to quantify the relationship between the program content signal 212 and the echo signal 234. Because the echo signal 234 may be substantially caused by interaction of the acoustic signal 222 with the surrounding environment, and the acoustic signal 222 is directly related to the program content signal 212, the relationship between the program content signal 212 and the echo signal 234 is substantially constant so long as (a) the environment remains constant, (b) the acoustic transducer 220 is not moved, and (c) the microphone 230 is not moved.

The processor 240 characterizes the relationship between the program content signal 212 and the echo signal 234 to determine whether a change in the relationship has occurred. A change in the relationship may signify a change in the acoustic environment, including the possibility that the audio system 200 has been moved. In some examples, the processor 240 quantifies the relationship by calculating one or more values representative of the relationship between the program content signal 212 and the echo signal 234, such as, for example, a cross-correlation of the program content signal 212 and the echo signal 234. In certain examples, the processor 240 compares the calculated value(s) with one or more previously calculated values, which may be stored in a memory coupled to or otherwise associated with the processor 240, to determine whether a change has occurred and/or how great of a change has occurred.

In some examples, the processor 240 applies a threshold to an amount of change in the calculated value(s) to determine whether a sufficient amount of change has occurred. When a change meets any of various criteria, the processor 240 indicates that a sufficient change has occurred by providing a signal at the output 250, which may be a binary logic signal or any other suitable signal or indicator, to indicate that a change in the acoustic environment has occurred. Various criteria may be applied to the amount of change in the calculated value(s) necessary to be sufficient to indicate a change in acoustic environment, and in some examples the criteria may be selected based upon a likelihood that the audio system generally, or the acoustic transducer 220 specifically, has been physically moved. In some examples, the criteria may be selected based upon a likelihood that the change in acoustic environment renders one or more equalization parameters less effective, and that equalization ought to be re-configured.

In certain examples, the microphone 230 is in a fixed position relative to the acoustic transducer 220, such as in the audio system 100 of FIG. 1. Accordingly, movement of either the acoustic transducer 220 or the microphone 230 is indicative of movement of the audio system, e.g., audio system 100. In other examples, the microphone 230 may be remote from the acoustic transducer 220, such as a puck or monitor microphone placed somewhere else in the environment, apart from the location of the acoustic transducer 220, yet suitable to provide the echo signal 234 for processing and quantifying the relationship between the program content signal 212 and the echo signal 234. Quantifying a relationship between two signals may be done in numerous ways and may result in various types of quantified values, such as scalar, vector, or complex values, and may include one or more individual values, arrays, or matrices. In various examples, the processor 240 may be located with the acoustic transducer 220, or may be located with the microphone 230, or may be located elsewhere, remote from either or both of the acoustic transducer 220 and the microphone 230.

Figure 3:
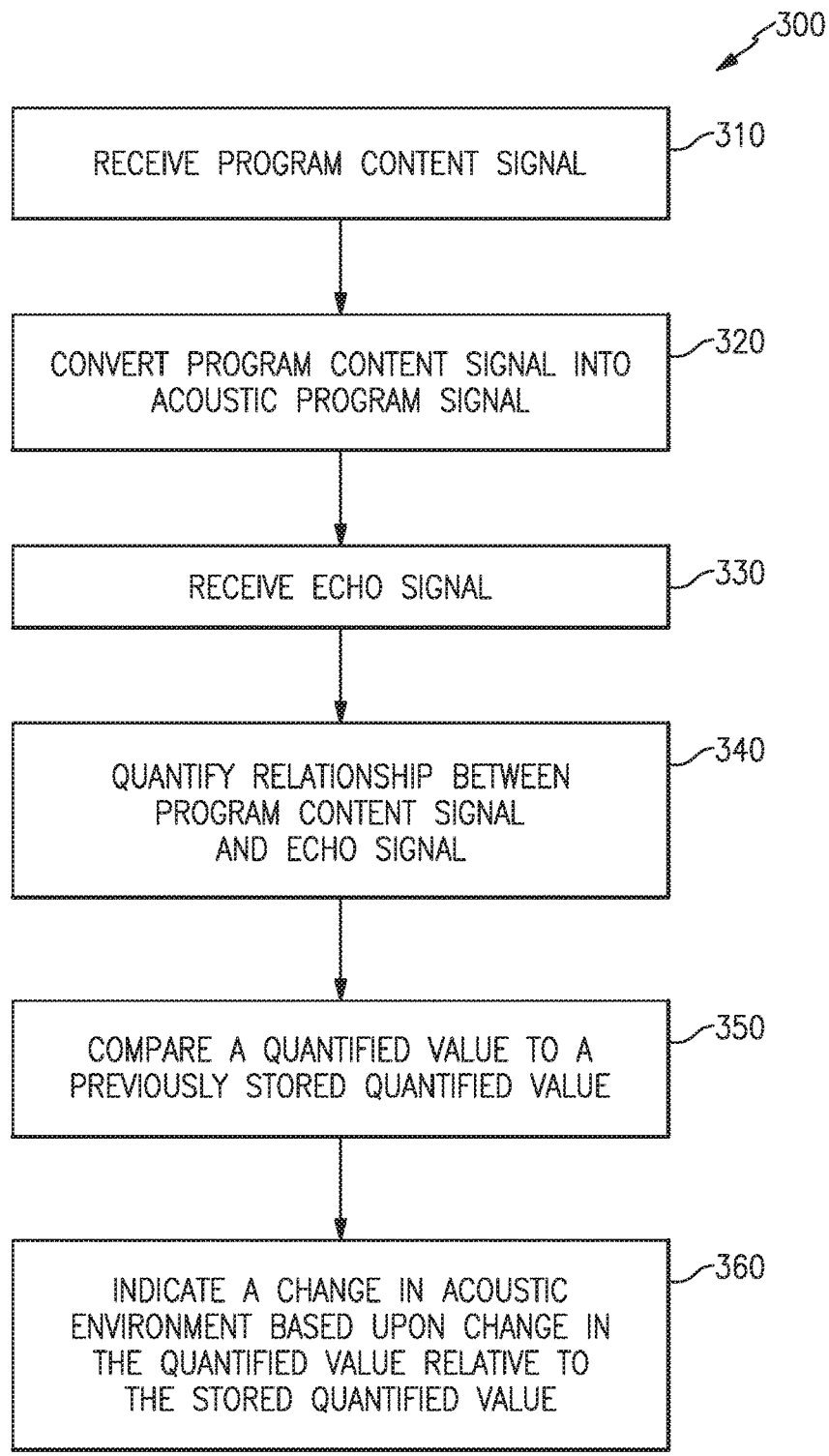
FIG. 3 is a flow diagram of an example method such as may be implemented by the audio processing system of FIG. 2.

FIG. 3 illustrates an example method 300 that may be performed by an audio processing system such as the audio processing system 200 of FIG. 2 to detect a change in acoustic environment. The method 300 includes receiving a program content signal (block 310) and converting the program content signal into an acoustic program signal (block 320), for example by the acoustic transducer 220. The method 300 also receives an echo signal (block 330) and quantifies a relationship (block 340) between the program content signal and the echo signal. The echo signal may include at least some content related to the program content signal by action of the acoustic program signal interacting with the environment and producing reflective acoustic energy that gets represented in the echo signal by, for example, the microphone 230. The method 300 further includes comparing (block 350) a quantified value (of the relationship between the program content signal and the echo signal) to a previously stored quantified value, and indicating (block 360) a change in the acoustic environment based upon the comparison.

As discussed above with respect to each of FIGS. 2 and 3, a relationship between a program content signal and an echo signal is quantified, e.g., by the processor 240, e.g., at block 340 of the method 300. The relationship between two signals may be quantified in various ways by various components through various methods. In some examples, a cross correlation between the program content signal and the echo signal is calculated and a resulting value or set of values may be stored and compared with future calculations. In certain examples, an adaptive filter includes an adaptive algorithm that updates filter coefficients in an attempt to match, or model, the transfer function from the program content signal to the echo signal, and one or more of the filter coefficients may be used as a quantified value for determining a change in the acoustic environment. In some examples, an adaptive echo cancellation subsystem maintains an adaptive filter to model the transfer function, and the method 300 compares one or more of the adaptive filter coefficients (quantified values) to previous adaptive filter coefficients (previously stored quantified values). In certain examples, such an echo cancellation subsystem may use various adaptive algorithms, such as a least mean squares (LMS) algorithm, a normalized least mean squares (NLMS) algorithm, a recursive least square (RLS) algorithm, or any combination or variation of these or other algorithms.

A program content signal may have any suitable spectral range, such as, for example, 20 Hz to 20,000 Hz being an acoustic range typically accepted as matching that of the human ear. In some examples, however, quantifying the relationship between the echo signal and the program content signal may be limited to a narrower spectrum. In certain examples, the echo signal and the program content signal may be filtered to a narrower bandwidth before quantifying their relationship. Alternately, the algorithm to quantify their relationship may be such that only a limited portion of the spectrum affects the quantification. In some examples, the spectral bandwidth for the quantification may include only frequencies below 16,000 Hz, or only below 8,000 hz, and in certain examples may be limited to frequencies below 4,000 Hz. In some examples, frequencies used for quantifying the relationship between signals are all in the range of 20 Hz to 8,000 Hz. In some examples the frequencies are all in the range of 60 Hz to 6,000 Hz, and in further examples the frequencies are all in the range of 100 Hz to 4,000 Hz.

In some examples, the program content signal may include user-selected program material. In certain examples, the program content signal may be a diagnostic signal, such as a chirp, noise, branded audio logo, or the like, and may be broadband or frequency-limited. In certain examples, a diagnostic signal may be used to directly measure a transfer function of the system, e.g., between the diagnostic signal as an input and the resulting echo signal as the output. In certain examples, a diagnostic signal may be used to directly quantify a relationship between the echo signal and the diagnostic signal.

In some examples, quantifying the relationship between the echo signal and the program content signal includes estimating a transfer function, e.g., between an input that receives the program content signal and a point where the resulting echo signal is detected, such as, for example, may be performed by an adaptive algorithm of an echo cancellation subsystem.

Figure 4:
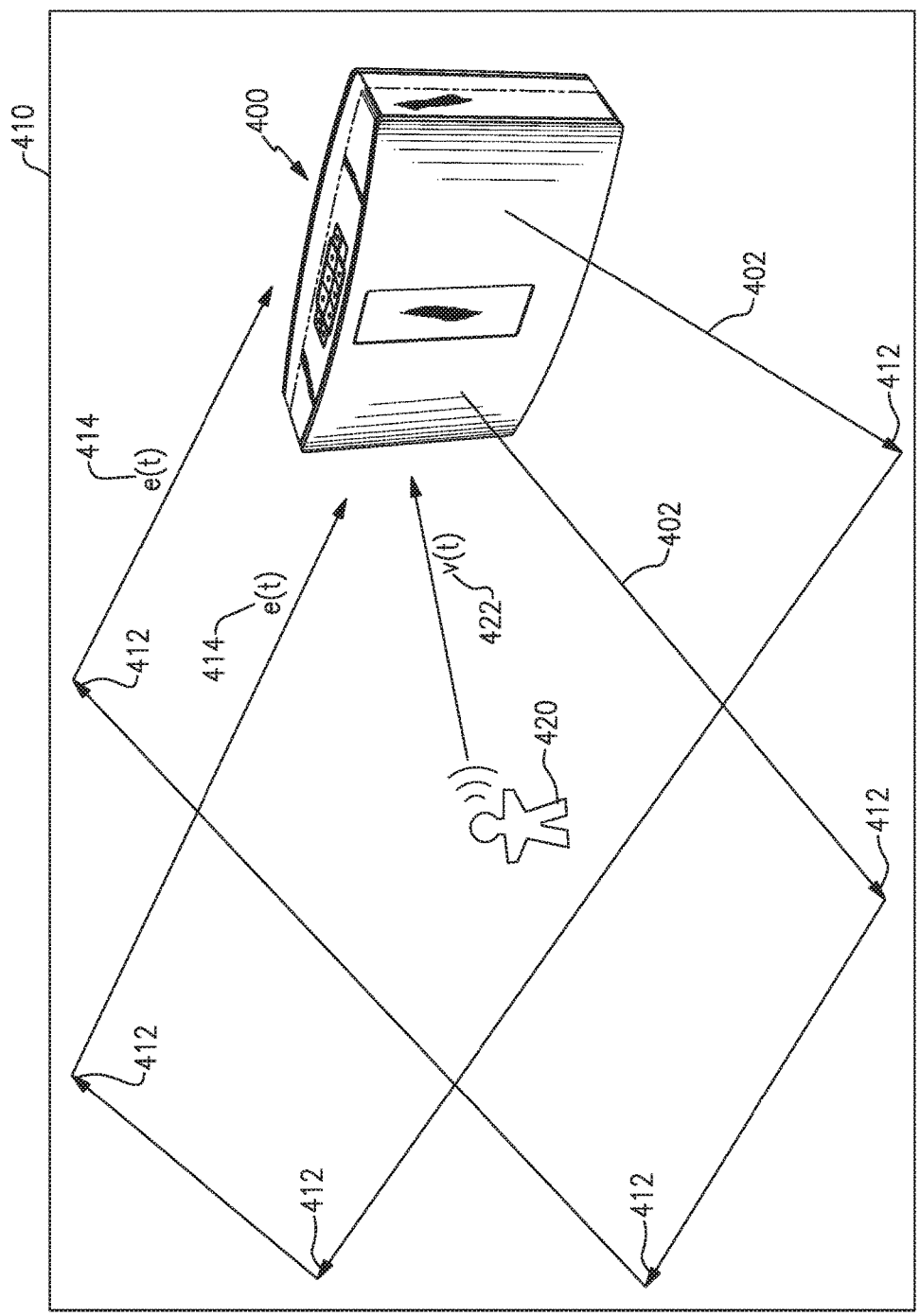
FIG. 4 is a schematic diagram of an audio speaker system in an illustrative environment.

FIG. 4 illustrates an example audio system 400 in an environment 410, such as a room, in which a user 420 may be listening to an acoustic program signal 402 provided by the audio system 400, such as music or a remote person talking on a telephone. The environment 410 may cause various reflections 412 of the acoustic program signal 402 and ultimately cause an acoustic echo signal 414, e(t), to arrive at a microphone associated with the audio system 400. Additionally, the user 420 may be speaking at various times and produce an acoustic voice signal 422, v(t), which also arrives at the microphone. The audio system 400 may include certain signal processing parameters, such as equalization parameters, that have been specially configured for the environment 410.

In the situation illustrated in FIG. 4, the user 420 may use the audio system 400 to listen to program content and the user 420 may speak a command to the audio system 400 or to another system coupled to the audio system 400, such as a virtual personal assistant (VPA) application, a music streaming application, or the like. For example, the audio system 400 may be coupled via a wired or wireless connection, e.g., a Bluetooth® connection, to a smartphone or other network-connected device. Similarly, the user 420 may use the audio system 400 to hold a telephone or teleconference conversation, e.g., using the audio system 400 as a speakerphone, and the audio system 400 may be coupled to a telephone system, for example a smartphone or other telephonic equipment, via a wireless or wired connection. A microphone associated with the audio system 400 picks up an acoustic echo signal 414 and an acoustic voice signal 422, as well as other acoustic noise or background sounds. Certain examples of the audio system 400 may include an echo cancellation component to isolate at least a portion of the user's voice by removing at least a portion of the echo, and the echo cancellation component may provide a quantified value of the relationship between the echo and the program content. As discussed above, such a quantified value may be a basis upon which a change in acoustic environment is detected, such as a physical movement of the audio system 400, and a change in acoustic environment may necessitate a reconfiguration of some signal processing parameters, such as equalization, for example.

Figure 5:
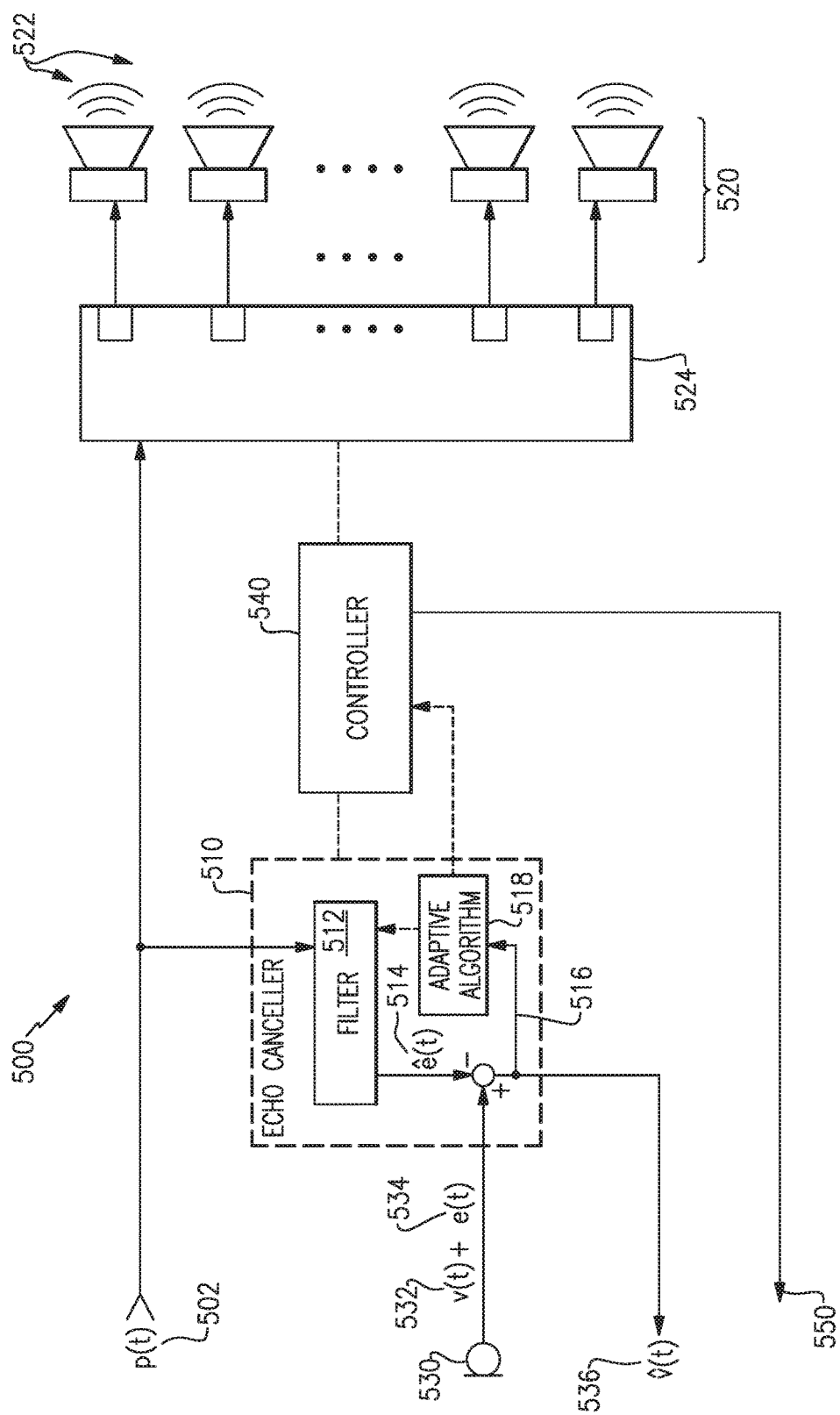
FIG. 5 is a schematic diagram of another example audio processing system.

FIG. 5 illustrates an example audio system 500 that includes an echo canceller 510, one or more acoustic drivers 520, one or more microphones 530, a controller 540, and an output 550 to indicate a change in acoustic environment, such as may be caused by speaker movement.

The audio system 500 receives a program content signal 502, p(t), that is converted into an acoustic program signal 522 by the one or more acoustic drivers 520. The acoustic drivers 520 may have further processing component(s) 524 associated with them, such as may provide array processing, amplification, equalization, mixing, etc. Additionally, the program content signal 502 may include multiple tracks, such as a stereo left and right pair, or multiple program content signals to be mixed or processed in various ways. The program content signal 502 may be an analog or digital signal and may be provided as a compressed and/or packetized stream, and additional information may be received as part of such a stream, such as instructions, commands, or parameters from another system for control and/or configuration of the processing component(s) 524, the controller 540, the echo canceller 510, or other components.

The block diagram illustrated in FIG. 5 of the example audio system 500 is a schematic representation and not necessarily illustrative of individual hardware elements. For instance, in some examples, each of the echo canceller 510, the processing component(s) 524, the controller 540, and other components and/or any portions or combinations of these, may be implemented in one set of circuitry, such as a digital signal processor, a controller, or other logic circuitry, and may include instructions for the circuitry to perform the functions described herein.

As discussed above, a microphone, such as the microphone 530, may receive each of an acoustic echo signal, an acoustic voice signal from a user, and other acoustic signals such as background and/or noise. The microphone 530 converts acoustic signals, e.g., into electrical signals, and provides them to the echo canceller 510. Specifically, when a user is speaking, the microphone 530 provides a voice signal 532, v(t), and an echo signal 534, e(t), as part of a combined signal to the echo canceller 510. The echo canceller 510 functions to attempt to remove the echo signal 534 from the combined signal to provide an estimated voice signal 536, P(t). The echo canceller 510 works to remove the echo signal 534 by processing the program content signal 502 through a filter 512 to produce an estimated echo signal 514, ê(t), which is subtracted from the combined signal provided by the microphone 530.

For example, the acoustic program signal 522 causes the echo signal 534, and if the filter 512 performs well at providing an estimated echo signal 514, the output of the echo canceller will be substantially that of the signal provided by the microphone 530 without any of the echo signal 534. Accordingly, the output of the echo canceller represents all other acoustic sound in the environment, which is substantially the voice signal 532 in the absence of any significant noise or alternate acoustic sources.

When an acoustic echo signal is substantially the only sound in the environment, i.e., the user is not speaking and there is little or no other sound in the environment, the output of the echo canceller is substantially a null signal. Accordingly, signal content present at the output of the echo canceller under such conditions is an error signal 516, representing the error in the estimated echo signal 514 relative to the (actual) echo signal 534. An adaptive algorithm 518 processes the error signal 516 to update the filter 512 to improve the estimated echo signal 514. Over time, the adaptive algorithm causes the filter 512 to converge on satisfactory parameters that produce a sufficiently accurate estimated echo signal 514, and thereafter only minimal updates are made to the filter 512. When other acoustic sources are present, the adaptive algorithm continues to minimize the error signal 516, in that whatever signal content cannot be accurately estimated by the filter 512 and removed must be from other acoustic sources, such as a user's voice signal.

A change in the acoustic environment may cause a shift in the acoustic transfer function between the program content signal 502 and the echo signal 534, causing the filter 512 to no longer produce a sufficiently accurate estimated echo signal 514. Movement of one or more of the acoustic drivers 520, the microphone 530, or other elements in the environment may cause such a change. The adaptive algorithm 518 detects that the estimated echo signal 514 is no longer sufficiently accurate and makes further adaptive updates to the filter 512. Accordingly, significant activity by the adaptive algorithm 518 and/or significant updates to the filter 512 may indicate a change in the acoustic environment, such as by a movement of one or more acoustic drivers 520, and such change may necessitate re-configuration of various signal processing parameters, such as equalization.

Significant activity by the adaptive algorithm 518 and/or significant updates to the filter 512, as discussed above, may be monitored and/or detected directly, such as by the adaptive algorithm 518 or the filter 512 reporting such to the controller 540, or may be monitored or detected indirectly, such as by the controller 540 monitoring changes to the filter 512 caused by activity of the adaptive algorithm 518. For example, the filter 512 may be a digital filter of n-th order and have a number of filter coefficients. The controller 540 may compare one or more of the filter coefficients, at any given time, to a previous value of the filter coefficient(s) (which may have been stored in the controller 540, the filter 512, the adaptive algorithm 518, or elsewhere) and determine whether one or more of the filter coefficients has changed by more than a threshold amount from a previous value. In certain examples, the filter 512 may have a most significant coefficient and the controller 540 may compare the most significant coefficient to previous values to determine an amount of change and further determine whether the change is sufficient to deem a change in acoustic environment. Upon determining such a change, the controller 540 may indicate the change at an output 550.

The output 550 may be of any form suitable for interpretation as an indication from the controller 540. The controller 540 provides, via the output 550, an indication that a change to the acoustic environment has occurred, or an indication that such a change necessitates re-configuration of one or more parameters, such as various signal processing parameters. In certain examples, the output 550 indicates that re-configuration of equalization parameters is required. In some examples, the output 550 may be a logic line providing a binary value, e.g., true/false, such as by various voltages. In other examples, the output 550 may be a message, such as by a network protocol or otherwise, that notifies a further system of the change in acoustic environment. In yet other examples, the output 550 may be a user-friendly indicator, such as by a light, buzzer, Bluetooth® notification, message screen, or the like to notify a user that a re-configuration is or may be necessary. In some examples, the output 550 may include a message that is provided to a user's mobile device for presentation via a user interface thereof. The message may include an instruction or suggestion for the user to perform a process for setting equalization parameters for the audio system 500, such as one of the processes described in U.S. patent application Ser. No. 15/086,962, filed Mar. 31, 2016, or U.S. Pat. No. 7,483,540, issued on Jan. 27, 2009, the complete disclosures of which are incorporated herein by reference.

In some examples, the output 550 may be an action triggered by or performed by the controller 540, such as an automatic re-configuration of one or more parameters. For example, the controller 540 may automatically reset an equalization to a default setting, or may adapt or adjust an equalization in a particular way in response to the acoustic environment and/or a change to the acoustic environment.

Adaptive algorithms, such as the adaptive algorithm 518, may use various techniques to adapt a filter, such as the filter 512, to improve at intervals the performance of the filter, such as to improve the estimated echo signal 514 in the example audio system 500 of FIG. 5. For example, the adaptive algorithm 518 may use a least mean squares (LMS) algorithm, a normalized least mean squares (NLMS) algorithm, a recursive least square (RLS) algorithm, or any combination or variation of these or other algorithms.

In certain examples, the filter 512, as adapted by the adaptive algorithm, converges to be representative of a transfer function of the audio system 500 and the acoustic environment in which it resides. The transfer function is a representation of how the program content signal 502 is transformed from its received form to cause (or become) the echo signal 534. Accordingly, the filter 512 may be representative, at least in part, of the acoustic response of the environment in which the audio system 500 is used. Further, in some examples, various parameters of the filter 512 may be analyzed by the controller 540 to determine whether the acoustic response of the environment has changed significantly and/or whether such a change is sufficient to necessitate re-configuration of one or more audio processing parameters. In certain examples, the controller 540 analyzes various parameters of the filter 512 to determine whether equalization should be re-configured. In certain examples, the controller 540 analyzes various parameters of the filter 512 to determine an adjustment to a set of equalization parameters, and in further examples the controller 540 may automatically make adjustments to equalization or other parameters.

In some examples, the controller 540 (or the processor 240, see FIG. 2) may analyze the relationship between the echo signal and the program content signal to determine characteristics of the environment. For example, the controller 540 may analyze various parameters of the filter 512 to determine placement characteristics of the audio system 500, such as whether the audio system 500 is placed outside, against a wall, in a corner, in a bookshelf, and the like. In some examples, the controller 540 may adapt parameters of the audio system 500 in response to the determined placement characteristics.

In some examples, the controller 540 analyzes various parameters of the filter 512 to distinguish between, or calculate a relative or representative value of the probability that a change in acoustic environment is due to an element (such as a piece of furnishing) changed in the environment, or a microphone (such as the microphone 520) has been moved, or an acoustic driver (such as one or more of the acoustic drivers 520) has been moved.

In certain examples, one or more acoustic drivers and one or more microphones are associated with an enclosure such that the acoustic drivers and microphones are in fixed positions relative to each other. Accordingly, a change in acoustic environment may be due to one of only two possibilities—either the audio system has moved or the environment in which it operates has been changed. In some examples, a controller analyzes a quantified value of the relationship between a program content signal and an echo signal, relative to previously stored values, to determine whether a change has occurred, whether the change is likely due to movement of the audio system, and/or whether the change is sufficient to necessitate reconfiguration of one or more signal processing parameters, such as equalization. The quantified value of the relationship between the program content signal and the echo signal may be, for example, a cross-correlation value, a parameter of an adaptive filter, such as a filter coefficient, a parameter calculated by an adaptive algorithm, examples of which are discussed above, or any of a combination of these or other values suitable to quantify or otherwise characterize a relationship between the program content signal and the echo signal.

In some examples, an audio system may include a plurality of acoustic drivers and/or a plurality of microphones, and may include various processing, which may include array processing, to process signals to the acoustic drivers and/or to process signals from the microphones, or a sub-set of either the acoustic drivers or microphones, as appropriate for various applications and/or changing operational requirements. FIG. 6 illustrates an example audio system 600 that includes multiple acoustic drivers 620, with associated processing component(s) 622, and multiple microphones 630 with associated processing component(s) 632. In other regards, the example audio system 600 may be similar to the example audio system 500 of FIG. 5. The processing component(s) 632 may process signals from the various microphones 630 in various ways. For example, array processing may direct a beam or a null in a certain direction relative to the set of microphones 630 and provide a combined signal to an echo canceller, a controller, etc. In some examples, one or more of the microphones 630 may experience better signal-to-noise ratio or other acoustic response characteristics, and the processing component(s) 632 may select one or more of the microphones 630 for provision of a signal to the echo canceller, controller, etc., or may allow one or more of the microphones 630 to more heavily influence (or be more heavily represented in) the signal provided to the echo canceller, controller, etc.

In some examples, a processor, controller, or the like, may analyze, characterize, or quantify a relationship between a program content signal and an echo signal to determine acoustic characteristics of the environment and/or to determine whether the acoustic characteristics have changed. As a result, the processor or controller may apply varying spatial signal processing based upon the determined acoustic characteristics, such as an analysis that indicates an audio system is located outside, against a wall, in a corner, or in a bookshelf, for example. The processor or controller may nullify, amend, reset to default, or otherwise modify certain signal processing parameters of the audio system, such as equalization parameters, for example, or may notify a user of the fact of a change in acoustic characteristics, and/or may prompt a user to nullify, amend, or re-configure certain parameters of the audio system.

In some examples, the processor or controller may prompt a user to rename the audio system, such as in response to a determination that the audio system may have been moved to an alternate environment, e.g., a different room. The processor or controller may nullify, amend, or re-configure certain voice capture settings, or notify or prompt the user to do so, such as noise reduction, filtering, or array processing parameters associated with signals provided by one or more microphones or by an echo canceller. In some examples, array processing may be included that may have directional processing parameters, such as the direction of noise and/or interference locations, and/or directions toward a user's voice, and the processor or controller may nullify, amend, or re-configure such parameters upon determining a change in acoustic environment, such as a movement of the audio system.

In some examples, the processor or controller may analyze, characterize, or quantify the signal relationship during a startup or boot procedure. To detect a change, the processor or controller may make comparison to previously stored information regarding the signal relationship. In some examples, the processor or controller may analyze, characterize, or quantify the signal relationship at various intervals, and also may detect a change by comparison to previously stored information regarding the signal relationship.

It should be understood that many, if not all, of the functions, methods, and/or components of the systems disclosed herein according to various aspects and examples may be implemented or carried out in a digital signal processor (DSP), a microprocessor, a logic controller, logic circuits, and the like, or any combination of these, and may include analog or digital circuit components and/or other components with respect to any particular implementation. Functions and components disclosed herein may operate in the digital domain, the analog domain, or a combination of the two, and certain examples include analog-to-digital converter(s) (ADC) and/or digital-to-analog converter(s) (DAC) where appropriate, despite the lack of illustration of ADC's or DAC's in the various figures. Any suitable hardware and/or software, including firmware and the like, may be configured to carry out or implement components of the aspects and examples disclosed herein, and various implementations of aspects and examples may include components and/or functionality in addition to those disclosed.

It should be understood that an acoustic transducer, or speaker, may be any of many types of transducers known in the art. For example, an acoustic structure coupled to a magnetic coil positioned in a magnetic field, to cause motion in response to electrical signals received by the coil, may be a suitable acoustic transducer. Additionally, a piezoelectric material may respond to electrical signals by expanding or contracting in one or more dimensions and may be a suitable acoustic transducer. In various examples, acoustic transducers may take other forms.

Some systems and/or methods in accord with aspects and examples disclosed herein are suitable for operation in differing environments. For example, the audio systems and methods disclosed herein have been discussed primarily for human interaction with human hearing and speech faculties in, e.g., an air environment. Certain examples operate in different mediums and/or for differing purposes. Certain examples may operate underwater to produce acoustic pressure waves (e.g., sound waves) in a water medium rather than an air medium. Certain examples may operate in an ultra-sonic or alternate frequency range outside the realm of human hearing for various purposes such as pest control or motion sensing.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of detecting movement of a device, the method comprising:
   receiving an audio program content signal;
   converting the audio program content signal into an acoustic signal;
   receiving an echo signal;
   quantifying a relationship between the echo signal and the audio program content signal to provide a quantified value;
   comparing the quantified value to a stored quantified value; and
   modifying an array processing parameter based at least in part upon the comparison, wherein modifying the array processing parameter based at least in part upon the comparison comprises modifying an array processing parameter of a plurality of microphones to alter a directional voice capture based on a device placement indicated at least in part by the comparison.

2. The method of claim 1 wherein quantifying a relationship between the echo signal and the audio program content signal includes determining filter coefficients of an echo cancellation system.

3. The method of claim 1 wherein quantifying a relationship between the echo signal and the audio program content signal includes performing at least one of a cross-correlation, a least mean squares algorithm, a normalized least mean squares algorithm, and a recursive least square algorithm.

4. The method of claim 1 further comprising prompting a user to reconfigure the device based at least in part upon the comparison.

5. An audio speaker system comprising:
   an input to receive an audio signal;
   an acoustic transducer coupled to the input to receive the audio signal and to convert the audio signal into an acoustic signal;
   an adaptive filter coupled to the input to receive the audio signal, and configured to receive an echo signal and to estimate a transfer function between the input and the echo; and
   a processor coupled to the adaptive filter and configured to compare a quantified value of the adaptive filter to a stored quantified value, and to modify an array processing parameter based at least in part upon the comparison, wherein modifying the array processing parameter based at least in part upon the comparison comprises modifying an array processing parameter of a plurality of microphones to alter a directional voice capture based on a device placement indicated at least in part by the comparison.

6. The audio speaker system of claim 5 wherein the quantified value includes one or more filter coefficients of the adaptive filter.

7. The audio speaker system of claim 5 wherein the adaptive filter is configured to estimate the transfer function by performing at least one of a cross-correlation, a least mean squares algorithm, a normalized least mean squares algorithm, and a recursive least square algorithm.

8. The audio speaker system of claim 5 further comprising a plurality of microphones coupled to the processor and configured to receive an echo of the acoustic signal to provide the echo signal to the adaptive filter, the array processing parameter defining, at least in part, a combination of signals from the plurality of microphones to provide the echo signal.

9. The audio speaker system of claim 8 wherein the plurality of microphones is remote from the acoustic transducer.

10. An audio device comprising:
   an acoustic transducer to convert an audio signal into acoustic sound pressure;
   a plurality of microphones to receive an acoustic echo related to the acoustic sound pressure and to convert the acoustic echo into an echo signal; and
   a processor configured to receive the audio signal and the echo signal, to quantify a relationship between the echo signal and the audio signal, to compare the quantified relationship to a stored quantified value, and to modify a response of the plurality of microphones based at least in part upon the comparison, wherein modifying the response of the plurality of microphones based at least in part upon the comparison comprises modifying an array processing parameter of the plurality of microphones to alter a directional voice capture based on a device placement indicated at least in part by the comparison.

11. The audio device of claim 10 further comprising an echo canceller and wherein the processor is further configured to determine one or more echo cancellation parameters, and to use one or more of the echo cancellation parameters as the quantified relationship between the echo signal and the audio signal.

12. The audio device of claim 10 wherein the processor is configured to quantify the relationship between the echo signal and the audio signal by performing at least one of a cross-correlation, a least mean squares algorithm, a normalized least mean squares algorithm, and a recursive least square algorithm.

13. The audio device of claim 10 further comprising notifying a user of a need to reconfigure one or more parameters based at least in part upon the comparison.

14. The method of claim 1 wherein modifying an array processing parameter of a plurality of microphones based on a device placement is based at least in part upon a proximity to a wall indicated at least in part by the comparison.

15. The method of claim 1 further comprising storing the stored quantified value during a startup procedure, and prompting a user to reconfigure the device based at least in part upon the comparison.

16. The audio speaker system of claim 5 wherein the processor is further configured to modify the array processing parameter to alter a directional voice capture based on a placement of the audio speaker system indicated at least in part by the comparison.

17. The audio speaker system of claim 5 wherein the processor is further configured to prompt a user to reconfigure the audio speaker system based at least in part by the comparison.

18. The audio device of claim 10 wherein the processor is configured to modify the response of the plurality of microphones by altering a directional response of the plurality of microphones by modifying an array parameter.

19. The audio device of claim 18 wherein the processor is configured to alter the direction response based at least in part upon a placement of the audio device indicated at least in part by the comparison.

\* \* \* \* \*